(12) United States Patent
Takahashi

(10) Patent No.: US 11,571,709 B2
(45) Date of Patent: Feb. 7, 2023

(54) SUBSTRATE TREATMENT METHOD AND SUBSTRATE TREATMENT APPARATUS

(71) Applicant: Tokyo Electron Limited, Tokyo (JP)

(72) Inventor: Teppei Takahashi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 45 days.

(21) Appl. No.: 16/845,178

(22) Filed: Apr. 10, 2020

(65) Prior Publication Data

US 2020/0338589 A1 Oct. 29, 2020

(30) Foreign Application Priority Data

Apr. 23, 2019 (JP) .............................. JP2019-082290

(51) Int. Cl.

| | |
|---|---|
| *B05D 1/00* | (2006.01) |
| *B05D 3/10* | (2006.01) |
| *H01L 21/67* | (2006.01) |
| *H01L 21/027* | (2006.01) |
| *G03F 7/16* | (2006.01) |
| *H01L 23/31* | (2006.01) |
| *H01L 23/29* | (2006.01) |

(52) U.S. Cl.
CPC ............. *B05D 1/005* (2013.01); *B05D 3/107* (2013.01); *G03F 7/162* (2013.01); *G03F 7/168* (2013.01); *H01L 21/0271* (2013.01); *H01L 21/6715* (2013.01); *H01L 23/293* (2013.01); *H01L 23/3171* (2013.01)

(58) Field of Classification Search
CPC ......... G03F 7/162; G03F 7/168; B05D 1/005; B05D 3/107
See application file for complete search history.

(56) References Cited

U.S. PATENT DOCUMENTS

| | | | |
|---|---|---|---|
| 6,312,996 B1 * | 11/2001 | Sogo .................... | H01L 29/7835 257/E29.268 |
| 2010/0264566 A1 * | 10/2010 | Moore .................... | B29C 35/08 264/401 |
| 2017/0207080 A1 * | 7/2017 | Kuga .................. | H01L 21/6708 |
| 2018/0211832 A1 * | 7/2018 | Hasimoto ......... | H01L 21/68764 |

FOREIGN PATENT DOCUMENTS

| | | |
|---|---|---|
| JP | 52-123172 A | 10/1977 |
| JP | 2003-173018 A | 6/2003 |
| JP | 2014-011420 A | 1/2014 |
| JP | 2017-191853 A | 10/2017 |

\* cited by examiner

*Primary Examiner* — James M Mellott
(74) *Attorney, Agent, or Firm* — Posz Law Group, PLC

(57) ABSTRACT

A substrate treatment method for treating a substrate, includes: (a) applying a coating solution to a front surface of the substrate by a spin coating method to form a coating film; (b) supplying a solvent for the coating solution to a projection of the coating film formed at a front surface peripheral edge of the substrate at (a); and (c) rotating the substrate in a state where the supply of the solvent is stopped, to move a top of the projection to an outside in a radial direction of the substrate. (b) and (c) are repeatedly performed. The projection is a buildup of the coating solution protruding from the coating film.

9 Claims, 9 Drawing Sheets

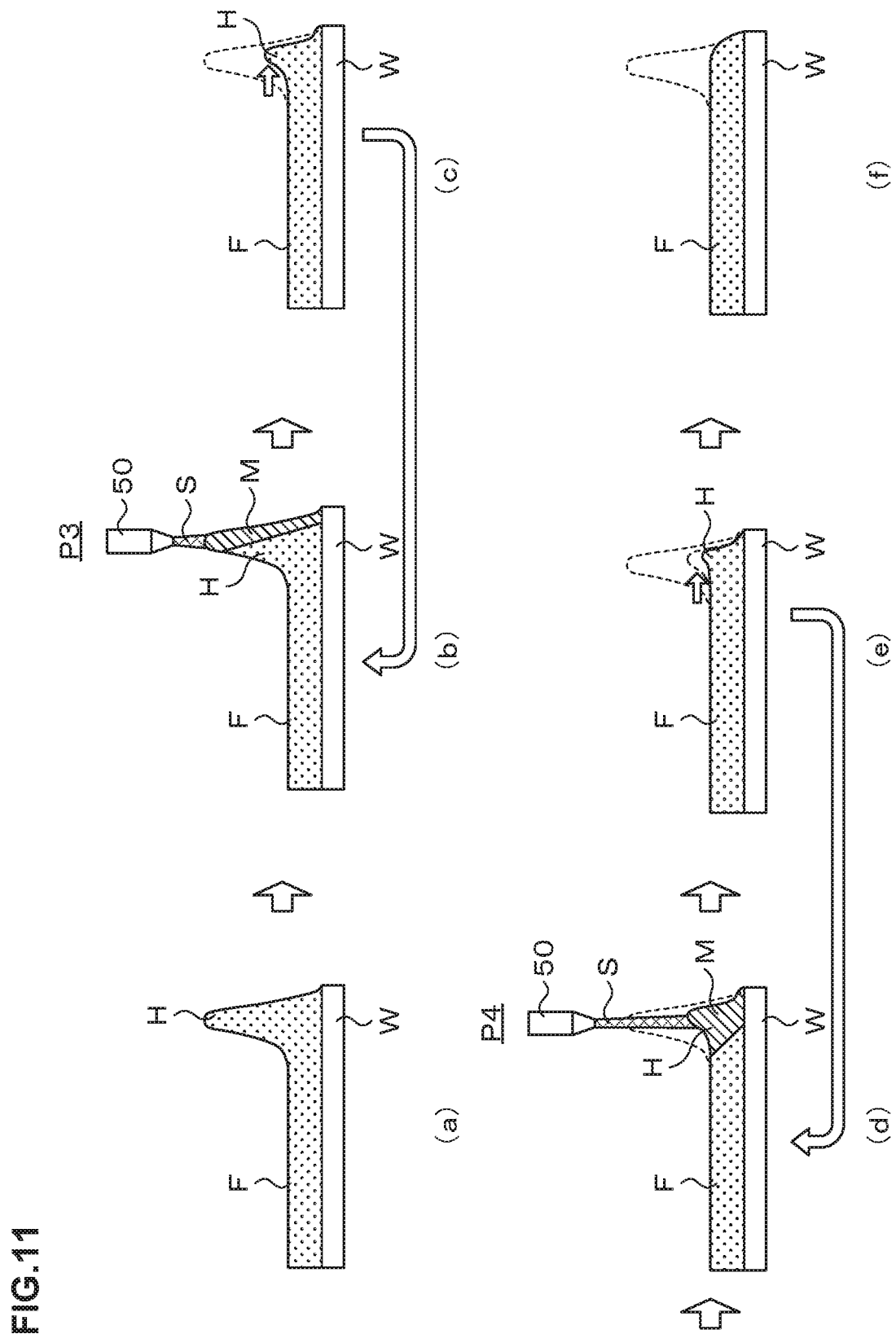

SUBSTRATE TREATMENT METHOD AND SUBSTRATE TREATMENT APPARATUS

CROSS REFERENCE TO RELATED APPLICATIONS

This application is based upon and claims the benefit of priority of the prior Japanese Patent Application No. 2019-82290, filed in Japan on Apr. 23, 2019, the entire contents of which are incorporated herein by reference.

TECHNICAL FIELD

This disclosure relates to a substrate treatment method and a substrate treatment apparatus.

BACKGROUND

Japanese Laid-open Patent Publication No. 2017-191853 discloses a method of discharging a coating solution from a nozzle to a front surface of a wafer to form a coating film, then discharging an organic solvent from a nozzle to a peripheral edge of the front surface of the wafer, and rotating the wafer in a short time and at a high speed.

SUMMARY

An aspect of this disclosure is a substrate treatment method for treating a substrate, includes: (a) applying a coating solution to a front surface of the substrate by a spin coating method to form a coating film; (b) supplying a solvent for the coating solution to a projection of the coating film formed at a front surface peripheral edge of the substrate at (a); and (c) rotating the substrate in a state where the supply of the solvent is stopped, to move a top of the projection to an outside in a radial direction of the substrate, (b) and (c) being repeatedly performed.

BRIEF DESCRIPTION OF THE DRAWINGS

FIG. 11 is an explanatory view illustrating a solution film state at the front surface peripheral edge of the wafer in the case of performing a coating treatment method according to a fourth embodiment.

DETAILED DESCRIPTION

Figure 1:
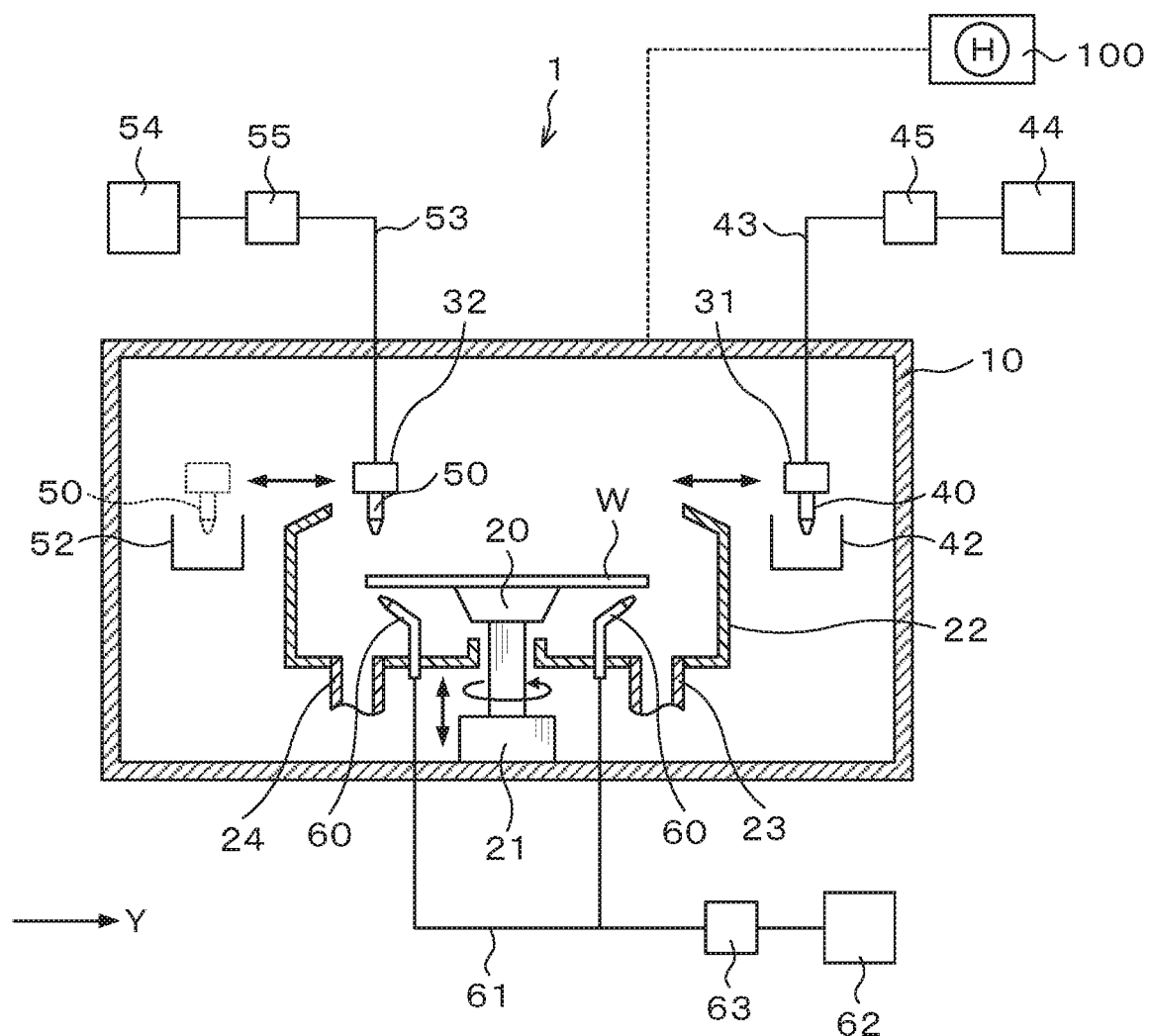
FIG. 1 is a longitudinal sectional view illustrating the outline of a configuration of a coating treatment apparatus according to this embodiment.

In photolithography processing in a manufacturing process of a semiconductor device, a resist coating treatment of applying a resist solution onto a semiconductor wafer (hereinafter, referred to as a wafer) as a substrate to form a resist film, exposure processing of exposing the resist film to a predetermined pattern, a developing treatment of developing the exposed resist film and so on are performed in sequence to form a predetermined resist pattern on the wafer.

In the aforementioned resist coating treatment, a so-called spin coating method of supplying the resist solution from a nozzle to a center portion of the rotating wafer to diffuse the resist solution on the wafer by centrifugal force to thereby apply the resist solution on the wafer is often used.

Incidentally, in manufacturing MEMS (Micro Electro Mechanical Systems) and the like recently, a resist film having a large thickness of, for example, about 20 μm to 80 μm is formed on the front surface of the wafer. In this event, a resist solution having a high viscosity of, for example, about 1000 cp to 10000 cp is used as a material of the resist film.

In the case of using a high-viscosity resist solution when forming the resist film having a large thickness as above, the resist solution is less likely to move on the front surface of the wafer, so that a protruding buildup (so-called hump) occurs at a front surface peripheral edge of the wafer and the resist film becomes particularly thick. Hence, for example, the method disclosed in Japanese Laid-open Patent Publication No. 2017-191853 discharges an organic solvent from a nozzle to a peripheral edge of the front surface of the wafer in order to remove the hump at the peripheral edge of the resist film. Further, the wafer is then rotated in a short time and at a high speed (so-called short spin), whereby the organic solvent and a residue dissolved with the organic solvent remaining on the front surface of the resist film is drained from the front surface of the resist film.

Further, in the manufacturing process of the semiconductor device, devices are formed on the front surface of the wafer, and then a protective film for protecting the devices is formed. This protective film also has a large thickness of, for example, about 20 μm to 80 μm, and a coating solution having a high viscosity of, for example, about 1000 cp to 10000 cp, for example, photosensitive polyimide is used as a material of the protective film.

Further, in the case of forming the protective film having the large thickness using the high-viscosity coating solution by the spin coating method, a hump occurs at the front surface peripheral edge of the wafer as in the aforementioned resist film. A conceivable example of the measure against the above is the removal of the hump by the supply of the organic solvent to the front surface peripheral edge of the wafer and the short spin.

However, in the case of removing the hump of the coating film such as the resist film or the protective film using the organic solvent as explained above, it is difficult to optimize a supply time and a supply position of the organic solvent. In other words, when the supply time and the supply position of the organic solvent are changed, the thickness of the coating film at the peripheral edge complexly changes and the prediction of its behavior is difficult, so that it is necessary to set the supply time and the supply position of the organic solvent by repeating try and error. Accordingly, there is room for improvement in the conventional coating film forming method.

Hence, the technique according to this disclosure removes a projection of a coating film formed at a front surface peripheral edge of a substrate to form the coating film uniformly within the substrate.

Hereinafter, a substrate treatment apparatus and a substrate treatment method according to this embodiment will be explained referring to the drawings. Note that the same codes are given to components having substantially the same functional configurations in the description and the drawings to omit duplicated explanation.

<Configuration of a Coating Treatment Apparatus 1>

Figure 2:
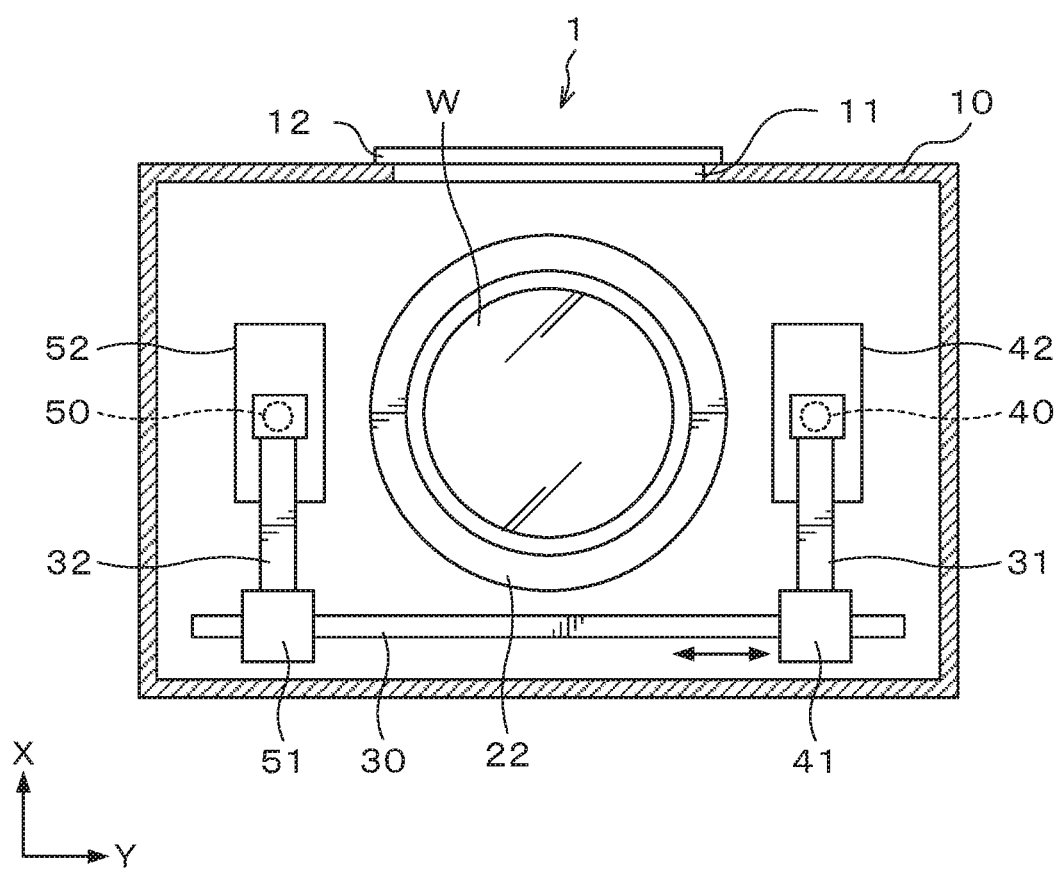
FIG. 2 is a transverse sectional view illustrating the outline of the configuration of the coating treatment apparatus according to this embodiment.

FIG. 1 is a longitudinal sectional view illustrating the outline of a configuration of a coating treatment apparatus 1 as a substrate treatment apparatus according to this embodiment. FIG. 2 is a transverse sectional view illustrating the outline of the configuration of the coating treatment apparatus 1 according to this embodiment. In the coating treatment apparatus 1 in this embodiment, a coating solution is applied to the front surface of the wafer by the spin coating method to form a coating film. Hereinafter, a case where the coating film is a protective film for protecting devices (not illustrated) formed on the front surface of the wafer W and the coating solution is a photosensitive polyimide having a high viscosity of, for example, about 1000 cp to 10000 cp will be explained.

As illustrated in FIG. 1, the coating treatment apparatus 1 has a treatment container 10 whose inside can be closed. As illustrated in FIG. 2, a side surface of the treatment container 10 is formed with a transfer-in/out port 11 for the wafer W, and an opening and closing shutter 12 is provided at the transfer-in/out port 11.

As illustrated in FIG. 1, at a middle portion in the treatment container 10, a spin chuck 20 as a substrate holder that holds and rotates the wafer W is provided. The spin chuck 20 has a horizontal upper surface, and the upper surface is provided with, for example, a suction port (not illustrated) for sucking the wafer W. By suction through the suction port, the wafer W can be suction-held on the spin chuck 20.

Below the spin chuck 20, a chuck drive 21 including, for example, a motor is provided. The spin chuck 20 can rotate at a predetermined speed by the chuck drive 21. Further, the chuck drive 21 is provided with a raising and lowering drive source such as a cylinder so that the spin chuck 20 can freely rise and lower.

Around the spin chuck 20, a cup 22 is provided which receives and collects liquid splashing or dropping from the wafer W. A drain pipe 23 that drains the collected liquid and an exhaust pipe 24 that exhausts the atmosphere inside the cup 22 are connected to a lower surface of the cup 22.

As illustrated in FIG. 2, on an X-direction negative direction (lower direction in FIG. 2) side of the cup 22, a rail 30 is formed which extends along a Y-direction (right-left direction in FIG. 2). The rail 30 is formed, for example, from a Y-direction negative direction (left direction in FIG. 2) side outer position to a Y-direction positive direction (right direction in FIG. 2) side outer position of the cup 22. To the rail 30, for example, two arms 31, 32 are attached.

As illustrated in FIG. 1 and FIG. 2, on a first arm 31, a coating solution nozzle 40 as a coating solution supplier which supplies the coating solution to the wafer W is supported. The first arm 31 is movable on the rail 30 by a nozzle drive 41 illustrated in FIG. 2. This allows the coating solution nozzle 40 to move from a waiting section 42 provided at a Y-direction positive direction side outer position of the cup 22 to above a center portion of the wafer W in the outer cup 22 and further move in a radial direction of the wafer W above the front surface of the wafer W. Further, the first arm 31 freely rises and lowers by the nozzle drive 41 to be able to adjust the height of the coating solution nozzle 40.

As illustrated in FIG. 1, to the coating solution nozzle 40, a supply pipe 43 is connected which supplies the coating solution to the coating solution nozzle 40. The supply pipe 43 communicates with a coating solution supply source 44 which stores the coating solution therein. Further, the supply pipe 43 is provided with a supply equipment group 45 including a valve, a flow regulator and so on for controlling the flow of the coating solution.

As illustrated in FIG. 1 and FIG. 2, on a second arm 32, a first solvent nozzle 50 as a solvent supplier (first solvent supplier) is supported which supplies a solvent for the coating solution such as a thinner. The second arm 32 is movable on the rail 30 by a nozzle drive 51 illustrated in FIG. 2, and can move the first solvent nozzle 50 from a waiting section 52 provided at a Y-direction negative direction side outer position of the cup 22 to above the center portion of the wafer W in the cup 22 and further move it in the radial direction of the wafer W above the front surface of the wafer W. Further, the second arm 32 freely rises and lowers by the nozzle drive 51 to be able to adjust the height of the first solvent nozzle 50. Note that in this embodiment, the rail 30, the second arm 32, and the nozzle drive 51 constitute a moving mechanism in this disclosure.

As illustrated in FIG. 1, to the first solvent nozzle 50, a supply pipe 53 is connected which supplies the solvent to the first solvent nozzle 50. The supply pipe 53 communicates with a solvent supply source 54 which stores the solvent therein. Further, the supply pipe 53 is provided with a supply equipment group 55 including a valve, a flow regulator and so on for controlling the flow of the solvent.

Note that the first arm 31 supporting the coating solution nozzle 40 and the second arm 32 supporting the first solvent nozzle 50 are attached to the same rail 30 in this embodiment, but may be attached to separate rails. Further, the coating solution nozzle 40 and the first solvent nozzle 50 are individually supported by the separate arms 31, 32 but may be supported by the same arm.

As illustrated in FIG. 1, below the spin chuck 20, a second solvent nozzle 60 as another solvent supplier (second solvent supplier) is provided which supplies a solvent for the coating solution such as a thinner. The second solvent nozzle 60 is provided at, for example, each of two points with respect to the wafer W held by the spin chuck 20.

To the second solvent nozzles 60, a supply pipe 61 is connected which supplies the solvent to the second solvent nozzles 60. The supply pipe 61 communicates with a solvent supply source 62 which stores the solvent therein. Further, the supply pipe 61 is provided with a supply equipment group 63 including a valve, a flow regulator and so on for controlling the flow of the solvent. Note that the solvent supply source 54 and the solvent supply source 62 are separately provided in this embodiment, but a common solvent supply source may be used.

In the above coating treatment apparatus 1, a controller 100 is provided as illustrated in FIG. 1. The controller 100 is, for example, a computer including a CPU, a memory and so on, and includes a program storage (not illustrated). In the program storage, a program for controlling the treatments on the wafer W in the coating treatment apparatus 1 is stored. Further, in the program storage, a program for controlling the operation of the coating treatment apparatus 1 to realize the later-explained coating treatment in the coating treatment apparatus 1 is also stored. Note that the above programs may be the ones that are recorded on a computer-readable storage medium H and installed from the storage medium H into the controller 100.

<Operation of the Coating Treatment Apparatus 1>

Figure 3:
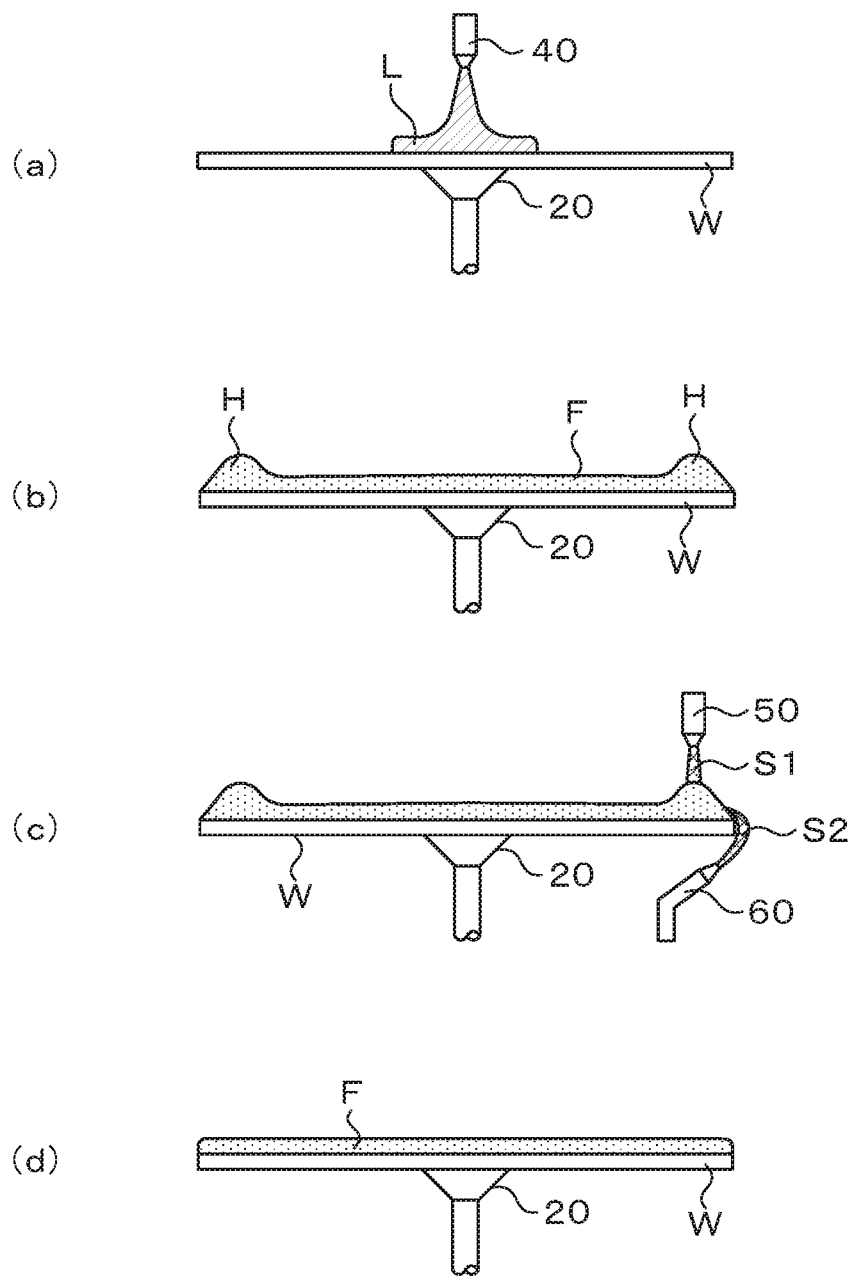
FIG. 3 is an explanatory view schematically illustrating a state of a solution film on a wafer at each step of a coating treatment.

Next, the coating treatment performed in the coating treatment apparatus 1 configured as above will be explained. In the coating treatment in this embodiment, a coating film having a large thickness of, for example, about 20 μm to 80 μm is formed on the wafer W. FIG. 3 schematically illustrates a state of a solution film on the wafer W at each step of the coating treatment.

The wafer W transferred into the coating treatment apparatus 1 is first suction-held on the spin chuck 20. Then, the coating solution nozzle 40 at the waiting section 42 is moved by the first arm 31 to above the center portion of the wafer W. In this event, the first solvent nozzle 50 waits at the waiting section 52.

Next, as illustrated in FIG. 3(*a*), in a state where the wafer W is being rotated, a coating solution L is supplied from the coating solution nozzle 40 to the center portion of the wafer W. Then, the coating solution L diffuses over the wafer W by the centrifugal force caused by the rotation of the wafer W, and forms a coating film F on the front surface of the wafer W as illustrated in FIG. 3(*b*). Note that when the supply of the coating solution L ends, the coating solution nozzle 40 moves to the waiting section 42.

In the case where the high-viscosity coating solution L is used here, the coating solution L is less likely to move on the front surface of the wafer W, so that a protruding buildup (hereinafter, referred to as a hump H) occurs in an annular shape in plan view at the front surface peripheral edge of the wafer W, resulting in a thick coating film F. In particular, in the case of forming the coating film F having a large thickness, the hump H becomes larger according to the larger amount of supply of the coating solution L. Hence, the solvent for the coating solution L (coating film F) is supplied to the hump H in order to remove the hump H so as to form the coating film F uniformly within the wafer.

Specifically, the first solvent nozzle 50 at the waiting section 52 is moved by the second arm 32 to above the peripheral edge of the wafer W. Subsequently, as illustrated in FIG. 3(*c*), a solvent 51 is supplied from the first solvent nozzle 50, namely, from the front surface side of the wafer W to the hump H. In this event, a solvent S2 may be supplied from the second solvent nozzle 60, namely, from the rear surface side of the wafer W to the hump H. Then, as illustrated in FIG. 3(*d*), the hump H is dissolved and removed with the solvent S1 (solvent S2). Note that the removal treatment of the hump H will be explained later in detail.

In the above manner, the coating film F having a thickness uniform within the wafer is formed, with which a series of coating treatment in the coating treatment apparatus 1 ends.

<Removal Treatment of the Hump H>

Next, the aforementioned removal treatment of the hump H at the front surface peripheral edge of the wafer W will be explained. Note that the peripheral edge in this embodiment refers to an annular part in a range outside of a radius of 140 mm from the center of the wafer W, for example, in the case where the radius of the wafer W is 150 mm.

(Conventional Method)

Figure 4:
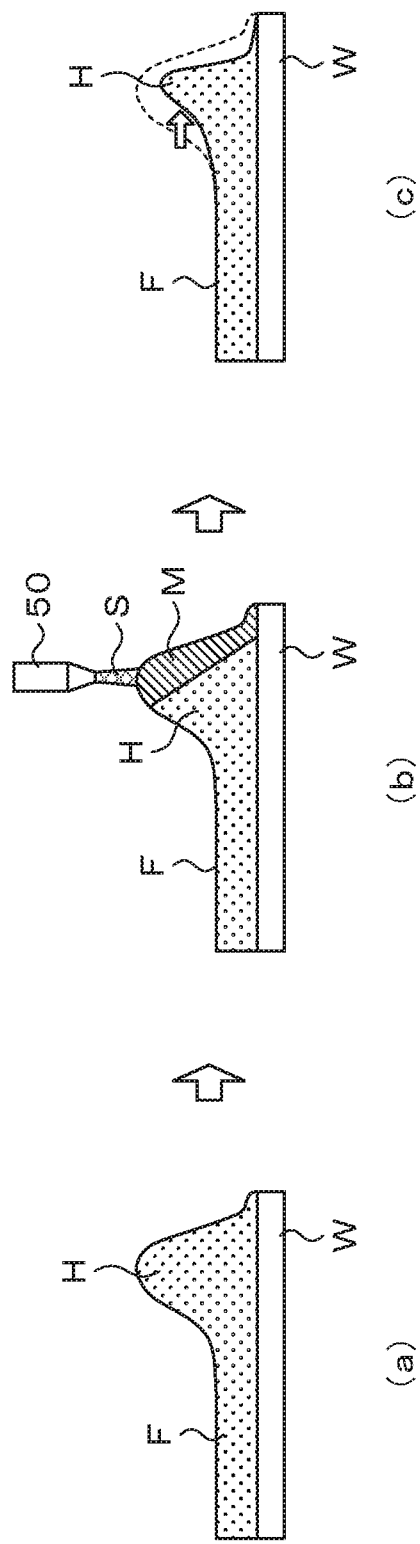
FIG. 4 is an explanatory view illustrating a solution film state at a front surface peripheral edge of the wafer in the case of performing a conventional coating treatment method.

In the case of forming the coating film F having a large thickness using the high-viscosity coating solution L as in this embodiment, the hump H becomes large. Therefore, as in the conventional coating treatment method disclosed in Japanese Laid-open Patent Publication No. 2017-191853, it is difficult to completely remove the hump H only by performing a step of supplying a solvent to the hump H (hereinafter, sometimes referred to as a solvent supply step), and a step of rotating the wafer W in a short time and at a high rotation speed (hereinafter, sometimes referred to as a short spin step). This point will be explained using FIG. 4. FIG. 4 illustrates a solution film state at the front surface peripheral edge of the wafer W in the case of performing the conventional coating treatment method.

By performing the coating treatment as illustrated in FIG. 4(*a*), the hump H of the coating film F is formed at the front surface peripheral edge of the wafer W. Thereafter, by supplying the solvent S to the hump H from the first solvent nozzle 50 while rotating the wafer W as illustrated in FIG. 4(*b*), the solvent S is supplied to the entire periphery of the hump H. Then, a part of the hump H is dissolved with the solvent S. Hereinafter, the dissolved portion of the hump H is referred to as a residue M. Thereafter, when the wafer W is rotated in a short time (for example, for 0.5 seconds) and at a high speed (for example, 1050 rpm), the solvent S and the residue M remaining on the front surface of the coating film F are drained by the centrifugal force from the front surface of the coating film F as illustrated in FIG. 4(*c*).

However, only by simply performing the solvent supply step and the short spin step as above, the hump H becomes smaller but the hump H still remains as illustrated in FIG. 4(*c*). The initial hump H illustrated in FIG. 4(*a*) is large and therefore cannot be completely removed only by the one-time supply of the solvent S. In addition, as illustrated in FIG. 4(*c*), the residue M on the outside of the hump H is drained from the front surface of the coating film F, whereas the residue M on the inside of the hump H flows toward the outside (see an arrow in FIG. 4(*c*)), and remains on the front surface of the coating film F to form again a hump H. Accordingly, when the solvent supply step and the short spin step are performed, the hump H remains at the front surface peripheral edge of the wafer W while its top position moves to the outside in the radial direction.

First Embodiment

Figure 5:
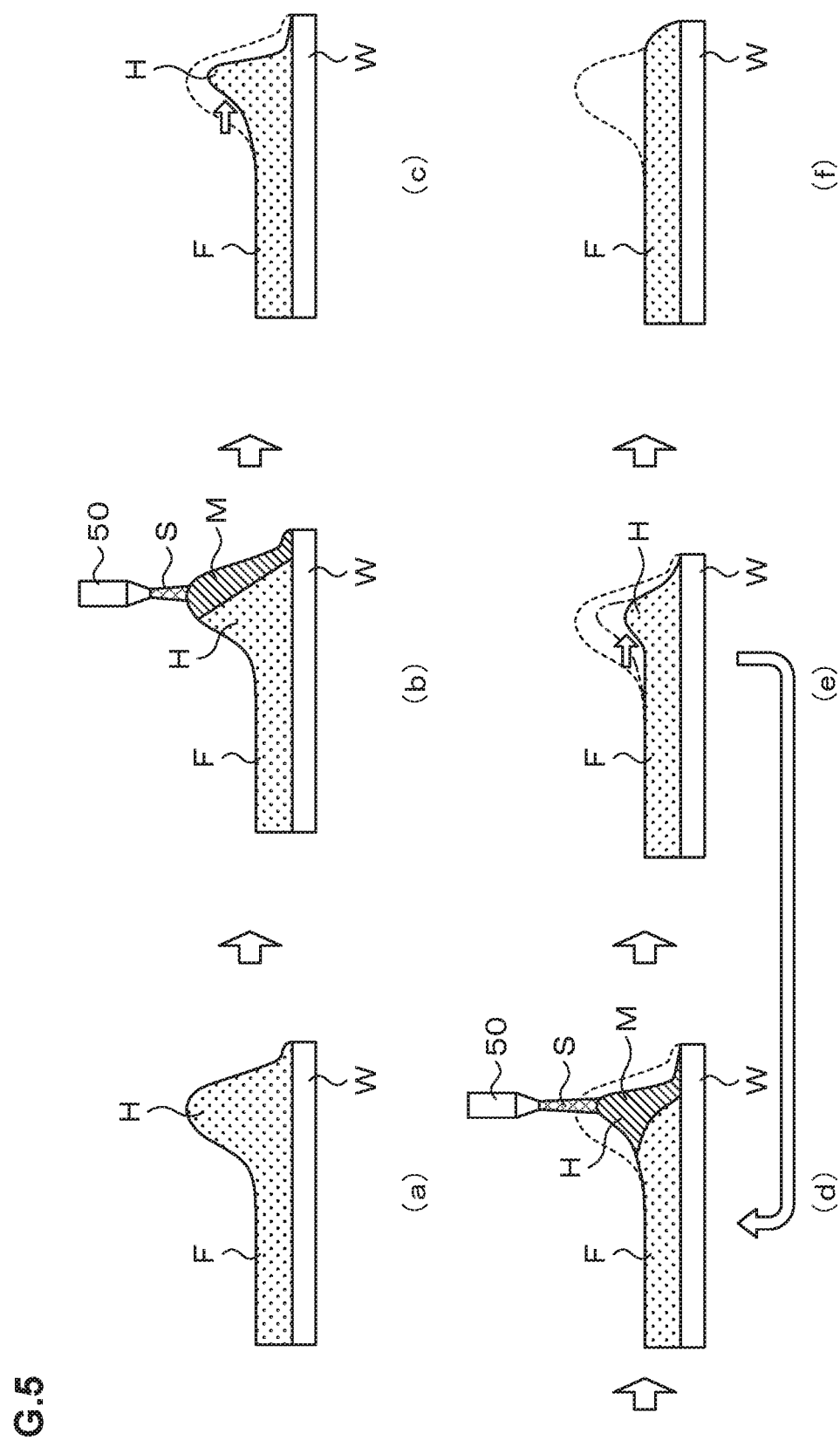
FIG. 5 is an explanatory view illustrating a solution film state at the front surface peripheral edge of the wafer in the case of performing a coating treatment method according to a first embodiment.

Hence, as a result of earnest study, the present inventors have arrived at repeated performance of the solvent supply step and the short spin step. In the following explanation, one-time treatment of the continuous solvent supply step and short spin step is referred to as a loop treatment, and the number of repeat times of the loop treatment is referred to as a loop count in some cases. FIG. 5 illustrates a solution film state at the front surface peripheral edge of the wafer W in the case of performing the coating treatment method according to the first embodiment.

By performing the coating treatment as illustrated in FIG. 5(*a*), the hump H of the coating film F is formed at the front surface peripheral edge of the wafer W. Note that at the end of the coating treatment, the first solvent nozzle 50 is moved to and the arranged at, for example, a position of 1 mm from an outer edge of the wafer W.

Thereafter, by supplying the solvent S from the first solvent nozzle 50 to the hump H while rotating the wafer W as illustrated in FIG. 5(*b*), the solvent S is supplied to the entire periphery of the hump H. In this event, the supply position of the solvent S is, for example, 7 mm from the outer edge of the wafer W, and the first solvent nozzle 50 is moved to the supply position of the solvent S at the solvent supply step. Further, the supply time of the solvent S is, for example, 10 seconds, and the rotation speed of the wafer W is, for example, 200 rpm. Then, a part of the hump H is dissolved with the solvent S.

Note that the rotation speed of the wafer W at the solvent supply step is preferably 500 rpm or less, and the supply time of the solvent S is preferably 10 seconds or less. Since the target thickness of the coating film F is large, it is preferable to set the rotation speed of the wafer W and the supply time of the solvent S to low in order to prevent excessive dissolution with the solvent S.

Thereafter, the supply of the solvent S is stopped, and the rotation of the wafer W is accelerated. Then, the wafer W is rotated in a short time and at a high speed. In this event, the rotation time of the wafer W is, for example, 0.5 seconds, and the rotation speed is, for example, 2000 rpm. By performing the short spin step, the solvent S and the residue M remaining on the front surface of the coating film F are drained by the centrifugal force from the front surface of the coating film F as illustrated in FIG. 5(*c*). Then, the hump H becomes smaller while its top position is moving toward the outside in the radial direction. Note that at the short spin step, the first solvent nozzle 50 is returned, for example, to the initial position of 1 mm from the outer edge of the wafer W.

Note that the rotation speed of the wafer W at the short spin step is preferably 2000 rpm or less. When the wafer W is rotated at a high speed of, for example, a rotation speed of more than 2000 rpm, the residue M becomes more likely to move to increase the remaining hump H. Further, when the wafer W is rotated at a high speed, air bubbles become likely to occur in the coating film F. Hence, the rotation speed of the wafer W is set to 2000 rpm in this embodiment.

The solvent supply step and the short spin step are finished after being performed one time in the conventional coating treatment method as illustrated in FIG. 4, whereas the solvent supply step and the short spin step are repeated in this embodiment. More specifically, the loop treatment of the solvent supply step illustrated in FIG. 5(*d*) and the short spin step illustrated in FIG. 5(*e*) is repeatedly performed. The solvent supply step and the short spin step in each loop treatment are performed by the methods explained using FIG. 5(*b*) and FIG. 5(*c*) respectively.

Note that during the loop treatment, namely, during the time from the finish of the short spin step to the performance of the next solvent supply step, it is preferable to set the rotation speed of the wafer W to 500 rpm or less while continuing the rotation of the wafer W. If the wafer W is rotated at a high speed between the loop treatments, the thickness of the coating film F possibly decreases as a whole.

Then, by repeatedly performing the loop treatment as illustrated in FIG. 5(*d*) and FIG. 5(*e*), the hump H is gradually removed while the top position of the hump H is moving to the outside in the radial direction in each loop treatment. As a result of this, the peripheral edge of the coating film F can be flattened as illustrated in FIG. 5(*f*).

Therefore, according to this embodiment, the coating film F having a uniform thickness can be formed on the front surface of the wafer W.

Further, in the conventional coating treatment method illustrated in FIG. 4, when the supply time of the solvent S and the supply position in the radial direction of the solvent S are changed, the thickness of the coating film F at the peripheral edge complexly changes and the prediction of its behavior is difficult, so that it is necessary to set the supply time and the supply position of an organic solvent by repeating the trial and error. Therefore, it is difficult to optimize the supply time and the supply position of the solvent S for condition setting.

Figure 6:
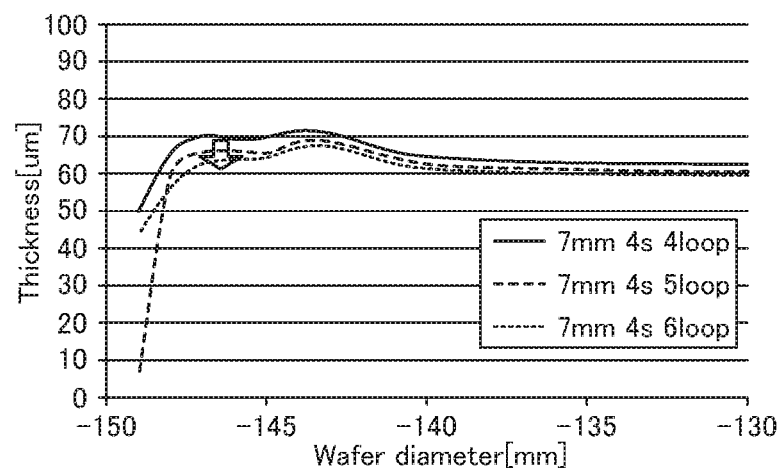
FIG. 6 is a graph indicating the change in thickness of a coating film at the front surface peripheral edge of the wafer in the case where the loop count is changed.
Figure 7:
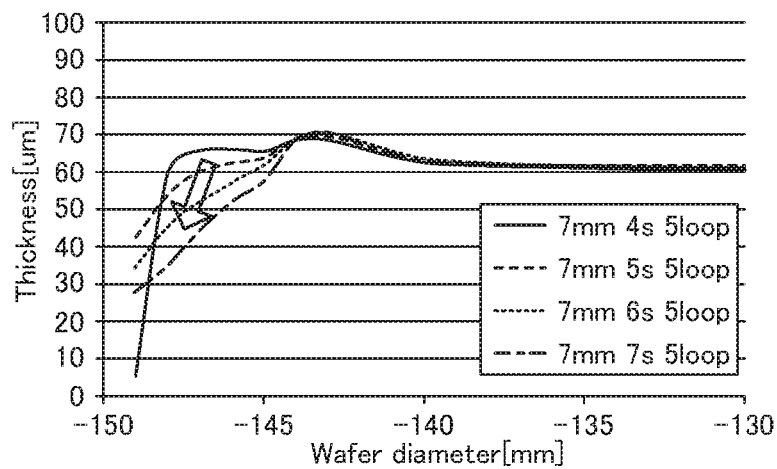
FIG. 7 is a graph indicating the change in thickness of the coating film at the front surface peripheral edge of the wafer in the case where the supply time of the solvent is changed.
Figure 8:
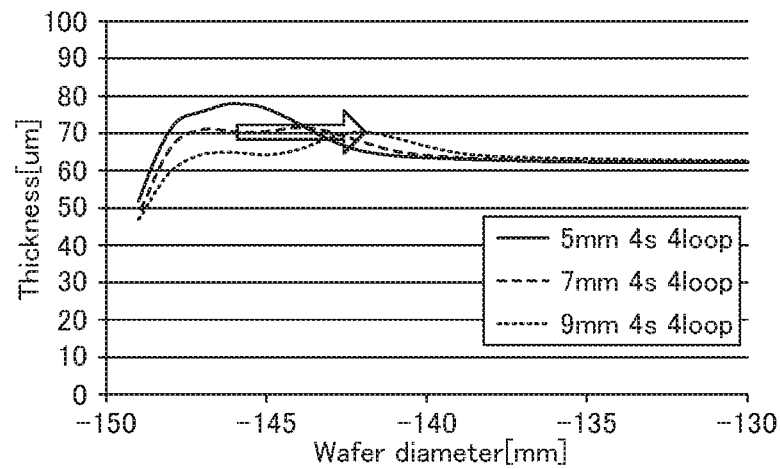
FIG. 8 is a graph indicating the change in thickness of the coating film at the front surface peripheral edge of the wafer in the case where the supply position of the solvent is changed.

In this regard, the method of repeatedly performing the loop treatment as in this embodiment, the parameters in the condition setting can be minimized, and the optimization of the treatment conditions can be easily performed. The concrete parameters for the condition setting are three parameters such as the loop count, the supply time of the solvent S, and the supply position in the radial direction of the solvent S. FIG. 6 to FIG. 8 are graphs indicating the change in thickness of the coating film F at the front surface peripheral edge of the wafer W in the case where the loop count, the supply time of the solvent S, and the supply position of the solvent S are changed, respectively. In FIG. 6 to FIG. 8, the horizontal axis indicates the position in the radial direction of the wafer W, and the vertical axis indicates the thickness of the coating film F. In this embodiment, the radius of the wafer W is 150 mm, and the position of the 150 mm on the horizontal axis indicates the outer edge of the wafer W.

As illustrated in FIG. 7, on the conditions that the loop count is fixed to five and the supply position of the solvent S is fixed to a position of 7 mm from the outer edge of the wafer W, the supply time of the solvent S is changed to 4 seconds, 5 seconds, 6 seconds, and 7 seconds. In this case, when the supply time of the solvent S is increased, the thickness of the coating film F radially outside the supply position of the solvent S decreases.

As illustrated in FIG. 8, on the conditions that the loop count is fixed to four and the supply time of the solvent S is fixed to 4 seconds, the supply position of the solvent S is changed to 5 mm, 7 mm, and 9 mm from the outer edge of the wafer W. In this case, as the supply position of the solvent S is moved to the inside in the radial direction, the top position of the hump H also moves to the inside in the radial direction.

When the supply time or the supply position of the solvent S is changed as explained above, the thickness of the coating film F at the peripheral edge complexly changes.

On the other hand, as illustrated in FIG. 6, on the conditions that the supply time of the solvent S is fixed to 4 seconds and the supply position of the solvent S is fixed to a position of 7 mm from the outer edge of the wafer W, the loop count is changed to 4, 5, and 6. In this case, when the loop count is increased, the thickness of the coating film F at the peripheral edge decreases as a whole. In other words, the coating film F is not locally changed as in the case of changing the supply time or the supply position of the solvent S, but the coating film F at the peripheral edge can be changed as a whole by controlling the loop count.

Thus, controlling the loop count according to the supply time and the supply position of the solvent S can change the coating film F at the peripheral edge as a whole, thereby removing the hump H. Thus, the optimization of the condition setting can be easily performed in this embodiment.

Next, other embodiments of the removal treatment of the hump H will be explained. Though the loop treatment is repeatedly performed in the above first embodiment, the loop treatment is also repeatedly performed and additionally a different treatment is performed in the other second to fourth embodiments. The following explanation will be made about the different points from the first embodiment.

Second Embodiment

Figure 9:
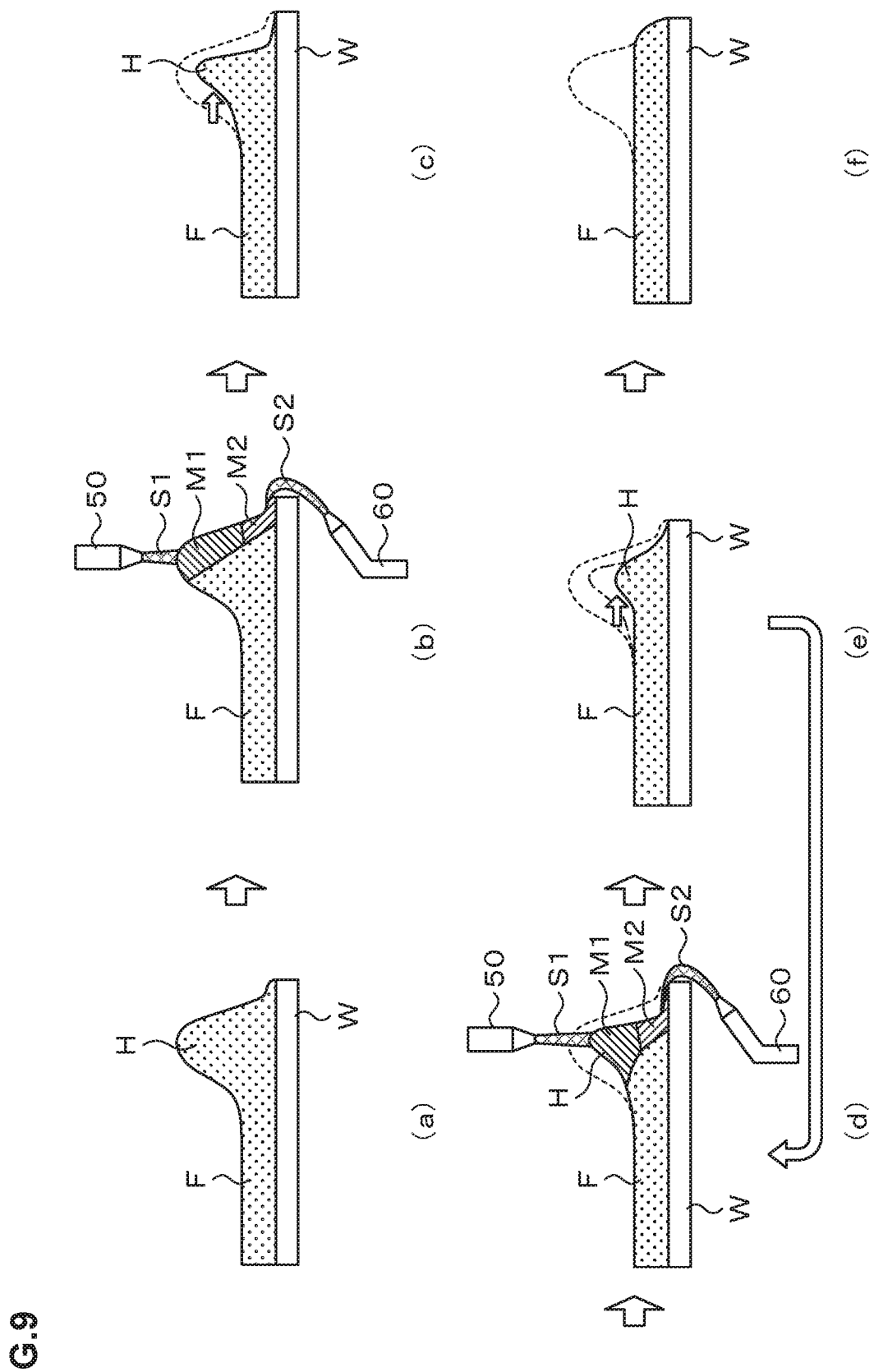
FIG. 9 is an explanatory view illustrating a solution film state at the front surface peripheral edge of the wafer in the case of performing a coating treatment method according to a second embodiment.

A second embodiment will be explained. FIG. 9 illustrates a solution film state at the front surface peripheral edge of the wafer W in the case of performing a coating treatment method according to the second embodiment. The solvent S is supplied from the front surface side of the wafer W to the hump H when performing the solvent supply step in the loop treatment in the first embodiment, whereas the solvent S is supplied from both the front surface side and the rear surface side of the wafer W to the hump H in the second embodiment.

As illustrated in FIG. 9(b), while the wafer W is being rotated, the solvent 51 is supplied from the first solvent nozzle 50 on the front surface side of the wafer W to the hump H and the solvent S2 is supplied from the second solvent nozzle 60 on the rear surface side of the wafer W to the hump H. In this event, both the supply times of the solvent S1 and the solvent S2 are, for example, 10 seconds, and the rotation speed of the wafer W is, for example, 200 rpm. The solvent 51 from the first solvent nozzle 50 dissolves an upper part of the hump H. In FIG. 9(b), the part dissolved with the solvent 51 is illustrated by a residue M1. The solvent S2 from the second solvent nozzle 60 comes around from the rear surface of the wafer W along the outer side surface to the front surface and dissolves a lower part of the hump H. In particular at the solvent supply step, the wafer W is rotated at a low speed, so that the solvent S2 from the rear surface side is likely to come around to the hump H on the front surface side. In FIG. 9(b), the part dissolved with the solvent S2 is illustrated by a residue M2.

Thereafter, the supply of the solvent 51 and the solvent S2 is stopped, and the wafer W is rotated in a short time and at a high speed. In this event, the rotation time of the wafer W is, for example, 0.5 seconds, and the rotation speed is, for example, 2000 rpm. By performing the short spin step, the solvents 51, S2 and the residues M1, M2 remaining on the front surface of the coating film F are drained by the centrifugal force from the front surface of the coating film F as illustrated in FIG. 9(c). Then, the hump H becomes smaller while its top position is moving to the outside in the radial direction.

Thereafter, the loop treatment of the solvent supply step illustrated in FIG. 9(d) and the short spin step illustrated in FIG. 9(e) is repeatedly performed. The solvent supply step and the short spin step in each loop treatment are performed by the methods explained using FIG. 9(b) and FIG. 9(c) respectively. Then, by repeatedly performing the loop treatment, the hump H is gradually removed while the top position of the hump H is moving to the outside in the radial direction in each loop treatment. As a result of this, the peripheral edge of the coating film F can be flattened as illustrated in FIG. 9(f).

Also in this embodiment, the coating film F having a uniform thickness can be formed on the front surface of the wafer W. In addition, the solvents S1, S2 are supplied to the hump H from both the front surface side and the rear surface side of the wafer W when performing the solvent supply step in each loop treatment, so that the solubility of the hump H can be further improved. In particular, at the solvent supply step, the wafer W is rotated at a low speed and the supply times of the solvents S1, S2 are short, thus providing a large effect of improving the solubility of the hump H with the solvents S1, S2. Further, since the solubility of the hump H is improved, the flowability of the residues M1, M2 increases and the residues M1, M2 therefore become more likely to be drained at the short spin step. Accordingly, the flatness of the coating film F can be further improved.

Note that the solvent S1 and the solvent S2 are simultaneously supplied to the hump H in this embodiment, but their supply timings may be different. For example, the solvent S2 may be supplied from the second solvent nozzle 60 to the hump H after the solvent S1 is supplied from the first solvent nozzle 50 to the hump H. Also in this case, the hump H can be dissolved with both the solvent S1 and the solvent S2. However, the simultaneous supply of the solvent S1 and the solvent S2 increases the solubility of the hump H.

Further, in this embodiment, the position where the solvent S1 is supplied from the first solvent nozzle 50 and the position where the solvent S2 is supplied from the second solvent nozzle 60 may be out of alignment with each other in a circumferential direction.

Third Embodiment

Figure 10:
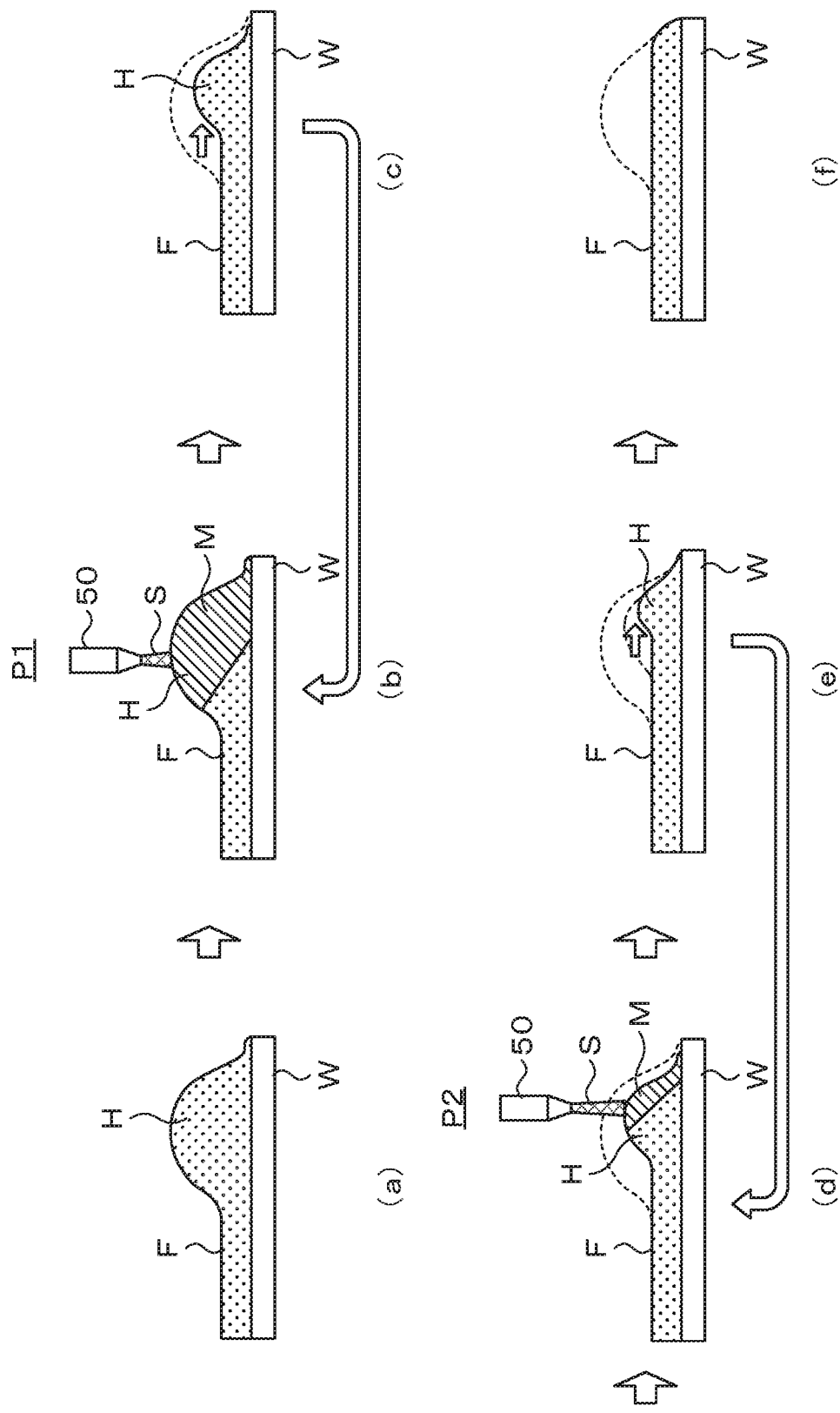
FIG. 10 is an explanatory view illustrating a solution film state at the front surface peripheral edge of the wafer in the case of performing a coating treatment method according to a third embodiment.

A third embodiment will be explained. FIG. 10 illustrates a solution film state at the front surface peripheral edge of the wafer W in the case of performing a coating treatment method according to the third embodiment. In the third embodiment, the supply position of the solvent S in each solvent supply step is moved from the inside to the outside in the radial direction in repeatedly performing the loop treatment.

As illustrated in FIG. 10(a), after the coating treatment is performed, the hump H having a large width spreads to the inside in the radial direction at the front surface outer periphery of the wafer W. Note that the shape and the position of the hump H are decided according to the kind of the coating solution L.

Further, at the end of the coating treatment, the first solvent nozzle 50 is arranged at, for example, a position of 1 mm from an outer edge of the wafer W. Hereinafter, the position of the first solvent nozzle 50 is referred to as a home position P0.

Thereafter, as illustrated in FIG. 10(b), the solvent S is supplied from the first solvent nozzle 50 to the hump H while rotating the wafer W. In this event, the supply position P1 of the solvent S is, for example, 7 mm from the outer edge of the wafer W. More specifically, at the solvent supply step, the first solvent nozzle 50 is moved from the home position P0 to the supply position P1, and further returned from the supply position P1 to the home position P0. Then, during the movement from the home position P0→the supply position P1→the home position P0, the solvent S is supplied from the first solvent nozzle 50.

Note that the solvent S is supplied also during the movement of the first solvent nozzle 50 at the solvent supply step in this embodiment, but the solvent S may be supplied only when the first solvent nozzle 50 is stopped at the supply position P1. However, if the solvent S is started to be supplied from the state where the first solvent nozzle 50 is stopped at the supply position P1, a great influence is exerted on one place of the hump H and the solvent S may possibly splash. Hence, the splash can be surely prevented by supplying the solvent S also during the movement of the first solvent nozzle 50 from the outside to the inside in the radial direction.

Thereafter, the supply of the solvent S is stopped, and the wafer W is rotated in a short time and at a high speed. By performing the short spin step, the solvent S and the residue M remaining on the front surface of the coating film F are drained by the centrifugal force from the front surface of the coating film F as illustrated in FIG. 10(*c*). Then, the hump H becomes smaller while its top position is moving to the outside in the radial direction. Note that at the short spin step, the first solvent nozzle 50 is returned to the home position P0.

Then, in this embodiment, the loop treatment of the solvent supply step illustrated in FIG. 10(*b*) and the short spin step illustrated in FIG. 10(*c*) is repeated two times.

Thereafter, the solvent supply step illustrated in FIG. 10(*d*) is performed. In this event, the supply position P2 of the solvent S is located outside the supply position P1, for example, 5 mm from the outer edge of the wafer W. Further, also at this solvent supply step, the first solvent nozzle 50 is moved from the home position P0 to the supply position P2, and further returned from the supply position P2 to the home position P0. Then, during the movement from the home position P0→the supply position P2→the home position P0, the solvent S is supplied from the first solvent nozzle 50.

Thereafter, the short spin step illustrated in FIG. 10(*e*) is performed. Then, the loop treatment of the solvent supply step illustrated in FIG. 10(*d*) and the short spin step illustrated in FIG. 10(*e*) is repeated three times.

In this embodiment, the supply position of the solvent S is moved from the inside in the radial direction (supply position P1) to the outside (supply position P2), whereby for the hump H having a large width and spreading to the inside in the radial direction illustrated in FIG. 10(*a*), the hump H at the inside portion can be removed first, and thereafter the hump H can be leveled off as a whole and then removed. In other words, the hump H can be appropriately removed by adjusting the supply position of the solvent S according to the shape of the hump H after the coating treatment.

In addition, by repeatedly performing the loop treatment, the top position of the hump H moves to the outside in the radial direction. In this regard, by moving the supply position of the solvent S from the inside to the outside in the radial direction, the solvent S can be surely supplied to the hump H.

Then, as a result of this, the peripheral edge of the coating film F can be flattened as illustrated in FIG. 10(*f*). Therefore, according to this embodiment, the coating film F having a uniform thickness can be formed on the front surface of the wafer W.

Fourth Embodiment

A fourth embodiment will be explained. FIG. 11 illustrates a solution film state at the front surface peripheral edge of the wafer W in the case of performing a coating treatment method according to the fourth embodiment. The supply position of the solvent S at each solvent supply step is moved from the inside to the outside in the radial direction in the above third embodiment, but the supply position of the solvent S at each solvent supply step is moved from the outside to the inside in the radial direction in the fourth embodiment.

As illustrated in FIG. 11(*a*), after the coating treatment is performed, the hump H having a small width exists only on the outside in the radial direction at the front surface outer periphery of the wafer W.

Thereafter, as illustrated in FIG. 11(*b*), the solvent S is supplied from the first solvent nozzle 50 to the hump H while rotating the wafer W. In this event, a supply position P3 of the solvent S is, for example, 3 mm from the outer edge of the wafer W. Then, the first solvent nozzle 50 is moved from the home position P0 to the supply position P3 and further moved from the supply position P3 to the home position P0, and supplies the solvent S during the movement.

Thereafter, the supply of the solvent S is stopped and the wafer W is rotated in a short time and at a high speed. By performing the short spin step, the solvent S and the residue M remaining on the front surface of the coating film F are drained by the centrifugal force from the front surface of the coating film F as illustrated in FIG. 11(*c*). Then, the hump H becomes smaller while its top position is moving to the outside in the radial direction. Note that at the short spin step, the first solvent nozzle 50 is returned to the home position P0.

Then, in this embodiment, the loop treatment of the solvent supply step illustrated in FIG. 11(*b*) and the short spin step illustrated in FIG. 11(*c*) is repeated two times.

Thereafter, the solvent supply step illustrated in FIG. 11(*d*) is performed. In this event, a supply position P4 of the solvent S is located inside the supply position P3, for example, 7 mm from the outer edge of the wafer W. Further, also at the solvent supply step, the first solvent nozzle 50 is moved from the home position P0 to the supply position P4 and further moved from the supply position P4 to the home position P0, and supplies the solvent S during the movement.

Thereafter, the short spin step illustrated in FIG. 11(*e*) is performed. Then, the loop treatment of the solvent supply step illustrated in FIG. 11(*d*) and the short spin step illustrated in FIG. 11(*e*) is repeated three times.

In this embodiment, the supply position of the solvent S is moved from the outside in the radial direction (supply position P3) to the inside (supply position P4), whereby for the hump H having a small width and existing only on the outside in the radial direction illustrated in FIG. 11(*a*), the hump H at the outside portion can be removed first, and thereafter the hump H can be leveled off as a whole and then removed. In other words, the hump H can be appropriately removed by adjusting the supply position of the solvent S according to the shape of the hump H after the coating treatment.

Then, as a result of this, the peripheral edge of the coating film F can be flattened as illustrated in FIG. 11(*f*). Therefore, according to this embodiment, the coating film F having a uniform thickness can be formed on the front surface of the wafer W.

The embodiments disclosed herein are only examples in all respects and should not be considered to be restrictive. The above embodiments may be abbreviated, replaced, or changed in various forms without departing from the scope and spirit of the attached claims.

Though the examples of forming the protective film on the front surface of the wafer have been explained in the above embodiments, this disclosure is also applicable to a coating treatment of applying another coating solution, for example, a resist solution to the front surface of the wafer to form a resist film. Further, the above embodiments are examples of performing the coating treatment on the wafer, but this disclosure is applicable also to a case where the substrate is a substrate other than the wafer, such as an FPD (Flat Panel Display) or a mask reticule for photomask.

Note that the following configurations belong to the technical scope of this disclosure.

(1) A substrate treatment method for treating a substrate, the substrate treatment method including:
(a) applying a coating solution to a front surface of the substrate by a spin coating method to form a coating film;
(b) supplying a solvent for the coating solution to a projection of the coating film formed at a front surface peripheral edge of the substrate at (a); and
(c) rotating the substrate in a state where the supply of the solvent is stopped, to move a top of the projection to an outside in a radial direction of the substrate,
(b) and (c) being repeatedly performed.

According to the (1), when the loop treatment of the continuous (b) and (c) is repeatedly performed, the projection is gradually removed while the top position of the projection is moving to the outside in the radial direction in each loop treatment. As a result of this, the peripheral edge of the coating film can be flattened and the coating film F having a uniform thickness can be formed on the front surface of the substrate. Further, when the loop treatment is repeatedly performed as in this manner, the parameters in the condition setting can be minimized, and the optimization of the treatment conditions can be easily performed.

(2) The substrate treatment method according to the (1), wherein at (b), the solvent is supplied from a front surface side of the substrate to the projection and the solvent is supplied from a rear surface side of the substrate to the projection.

According to the (2), the solvent is supplied to the projection from both the front surface side and the rear surface side of the substrate, so that the solubility of the projection can be further improved. Further, since the solubility of the projection is improved, the flowability of the residue of the dissolved projection increases and the residue therefore becomes more likely to be drained at (c). Accordingly, the flatness of the coating film can be further improved.

(3) The substrate treatment method according to the (2), wherein at (b), the supply of the solvent from the front surface side of the substrate and the supply of the solvent from the rear surface side of the substrate are simultaneously performed.

(4) The substrate treatment method according to one of the (1) to (3), wherein when repeatedly performing (b) and (c), a supply position of the solvent at (b) is moved in the radial direction of the substrate.

According to the (4), the supply position of the solvent at (b) is moved in the radial direction of the substrate according to the shape of the projection, so that the projection can be appropriately removed.

(5) The substrate treatment method according to the (4), wherein the supply position of the solvent at (b) is moved from an inside to the outside in the radial direction of the substrate.

(6) The substrate treatment method according to the (4), wherein the supply position of the solvent at (b) is moved from the outside to an inside in the radial direction of the substrate.

(7) The substrate treatment method according to one of the (1) to (6), wherein a number of times of repeating (b) and (c) is controlled according to a supply time and a supply position of the solvent at (b) to control a thickness of the coating film.

(8) The substrate treatment method according to one of the (1) to (7), wherein:
the supply of the solvent at (b) is performed while the substrate is being rotated;
a rotation speed of the substrate at (c) is higher than a rotation speed of the substrate at (b); and
the rotation speed of the substrate at (c) is 2000 rpm or less.

(9) The substrate treatment method according to one of the (1) to (8), wherein a viscosity of the coating solution is 1000 cp to 10000 cp.

(10) A substrate treatment apparatus for treating a substrate, the substrate treatment apparatus including:
a substrate holder configured to hold and rotate the substrate;
a coating solution supplier configured to apply a coating solution to the substrate held by the substrate holder;
a solvent supplier configured to supply a solvent for the coating solution from a front surface side of the substrate to a peripheral edge of the substrate held by the substrate holder; and
a controller configured to control the substrate holder, the coating solution supplier, and the solvent supplier to execute:
(a) applying the coating solution to a front surface of the substrate by a spin coating method to form a coating film;
(b) supplying a solvent for the coating solution to a projection of the coating film formed at a front surface peripheral edge of the substrate at (a); and
(c) rotating the substrate in a state where the supply of the solvent is stopped, to move a top of the projection to an outside in a radial direction of the substrate,
(b) and (c) being repeatedly performed.

(11) The substrate treatment apparatus according to the (10), further including another solvent supplier configured to supply the solvent from a rear surface side of the substrate to the peripheral edge of the substrate held by the substrate holder, wherein the controller is configured to control the solvent supplier and the another solvent supplier to supply the solvent from the front surface side of the substrate to the projection and supply the solvent from the rear surface side of the substrate to the projection at (b).

(12) The substrate treatment apparatus according to the (10) or (11), further including a moving mechanism configured to move the solvent supplier in a horizontal direction, wherein the controller is configured to control, when repeatedly performing (b) and (c), the solvent supplier and the moving mechanism to move a supply position of the solvent at (b) in the radial direction of the substrate.

According to this disclosure, it is possible to remove a projection of a coating film formed at a front surface peripheral edge of a substrate so as to form the coating film uniformly within the substrate.

What is claimed is:
1. A substrate treatment method for treating a substrate, the substrate treatment method comprising:
(a) applying a coating solution to a front surface of the substrate by a spin coating method to form a coating film;
(b) supplying a solvent for the coating solution to a projection of the coating film formed at a front surface peripheral edge of the substrate at (a), wherein the projection is a buildup of the coating solution protruding from the coating film; and

(c) rotating the substrate in a state where the supply of the solvent is stopped, to move a top of the projection to an outside in a radial direction of the substrate, (b) and (c) being repeatedly performed.

2. The substrate treatment method according to claim 1, wherein at (b), the solvent is supplied from a front surface side of the substrate to the projection and the solvent is supplied from a rear surface side of the substrate to the projection.

3. The substrate treatment method according to claim 2, wherein at (b), the supply of the solvent from the front surface side of the substrate and the supply of the solvent from the rear surface side of the substrate are simultaneously performed.

4. The substrate treatment method according to claim 1, wherein when repeatedly performing (b) and (c), a supply position of the solvent at (b) is moved in the radial direction of the substrate.

5. The substrate treatment method according to claim 4, wherein the supply position of the solvent at (b) is moved from an inside to the outside in the radial direction of the substrate.

6. The substrate treatment method according to claim 4, wherein the supply position of the solvent at (b) is moved from the outside to an inside in the radial direction of the substrate.

7. The substrate treatment method according to claim 1, wherein a number of times of repeating (b) and (c) is controlled according to a supply time and a supply position of the solvent at (b) to control a thickness of the coating film.

8. The substrate treatment method according to claim 1, wherein:

the supply of the solvent at (b) is performed while the substrate is being rotated;

a rotation speed of the substrate at (c) is higher than a rotation speed of the substrate at (b); and the rotation speed of the substrate at (c) is 2000 rpm or less.

9. The substrate treatment method according to claim 1, wherein a viscosity of the coating solution is 1000 cp to 10000 cp.

* * * * *